(12) United States Patent
Qiu et al.

(10) Patent No.: US 12,094,790 B2
(45) Date of Patent: Sep. 17, 2024

(54) TESTKEY STRUCTURE FOR SEMICONDUCTOR DEVICE

(71) Applicant: United Semiconductor (Xiamen) Co., Ltd., Fujian (CN)

(72) Inventors: Zhi Xiang Qiu, Shamen (CN); Rong He, Shamen (CN); Hailong Gu, Singapore (SG); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 413 days.

(21) Appl. No.: 17/709,392

(22) Filed: Mar. 30, 2022

(65) Prior Publication Data
US 2023/0245934 A1 Aug. 3, 2023

(30) Foreign Application Priority Data
Jan. 28, 2022 (CN) .......................... 202210104888.8

(51) Int. Cl.
*H01L 21/66* (2006.01)
(52) U.S. Cl.
CPC .................................... *H01L 22/34* (2013.01)
(58) Field of Classification Search
None
See application file for complete search history.

(56) References Cited

U.S. PATENT DOCUMENTS

2018/0342618 A1\* 11/2018 Chen ................. H01L 29/41783
2020/0168701 A1\* 5/2020 Lin ........................ H10B 41/10

\* cited by examiner

*Primary Examiner* — William C Trapanese
(74) *Attorney, Agent, or Firm* — Winston Hsu (57) ABSTRACT

A testkey structure for semiconductor device includes a substrate, a gate structure disposed on the substrate, and a plurality of first dummy gate structures disposed on the substrate and arranged around the gate structure. A bottom surface of the gate structure is lower than bottom surfaces of the first dummy gate structures. A top surface of the gate structure is flush with top surfaces of the first dummy gate structures.

15 Claims, 11 Drawing Sheets

TESTKEY STRUCTURE FOR SEMICONDUCTOR DEVICE

BACKGROUND OF THE INVENTION

1. Field of the Invention

The present invention relates to a testkey structure for a semiconductor device. More particularly, the present invention relates to a testkey structure for monitoring a metal gate structure of a semiconductor device.

2. Description of the Prior Art

In the field of semiconductor fabrication, replacement metal gate process has been widely used to form metal gates of semiconductor devices. A replacement metal gate process usually includes the steps of forming a gate trench in an interlayer dielectric layer by removing a sacrificial gate structure from the interlayer dielectric layer, and then filling the gate trench with a metal gate material (such as a work function metal layer and a low resistance metal layer). A replacement metal gate structure formed by the metal gate material filled in the gate trench may be obtained. The aspect ratio and profile of the opening of the gate trench significantly affect the filling capability of the metal gate material to fill the gate trench. If the aspect ratio of the gate trench is too high or the width of the opening is too small, it is more likely that the opening of the gate trench is sealed before the gate trench is completely filled, causing void defects in the metal gate structure.

Currently, optical defect inspection tools such as bright field inspection tools are utilized in inline inspection steps to inspect the void defects. However, due to the slow inspection speed of the optical defect inspection tools, only a few of the wafers may be inspected to avoid slowing down the throughput. Meanwhile, it is difficult for the optical defect inspection tools to recognize the void defects buried inside the metal gate structure.

In light of the above, there is still a need in the field for a testkey structure that may quickly and effectively observe the void defects of a poorly filled metal gate structure.

SUMMARY OF THE INVENTION

The present invention is directed to provide a testkey structure for a semiconductor device. More particularly, the present invention provides a testkey structure for monitoring the resistance of a gate structure in a wafer acceptance test (WAT). The integrity of the gate structure may be judged by analyzing the WAT resistance data of the gate structure.

One aspect of the invention provides a testkey structure for a semiconductor device including a substrate, a gate structure disposed on the substrate, and a plurality of first dummy gate structures disposed on the substrate and arranged around the gate structure, wherein a bottom surface of the gate structure is lower than bottom surfaces of the first dummy gate structures, and a top surface of the gate structure is flush with top surfaces of the dummy gate structures.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. Relative dimensions and proportions of parts of the drawings have been shown exaggerated or reduced in size, for the sake of clarity and convenience in the drawings. The same reference signs are generally used to refer to corresponding or similar features in modified and different embodiments. It should be understood that spatial descriptions used herein are for purposes of illustration only, and that practical implementations of the structures described herein can be spatially arranged in any orientation or manner. These embodiments are described in sufficient detail to enable those skilled in the art to practice the invention. Other embodiments may be utilized and that structural, logical and electrical changes may be made without departing from the spirit and scope of the present invention.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

Figure 1:
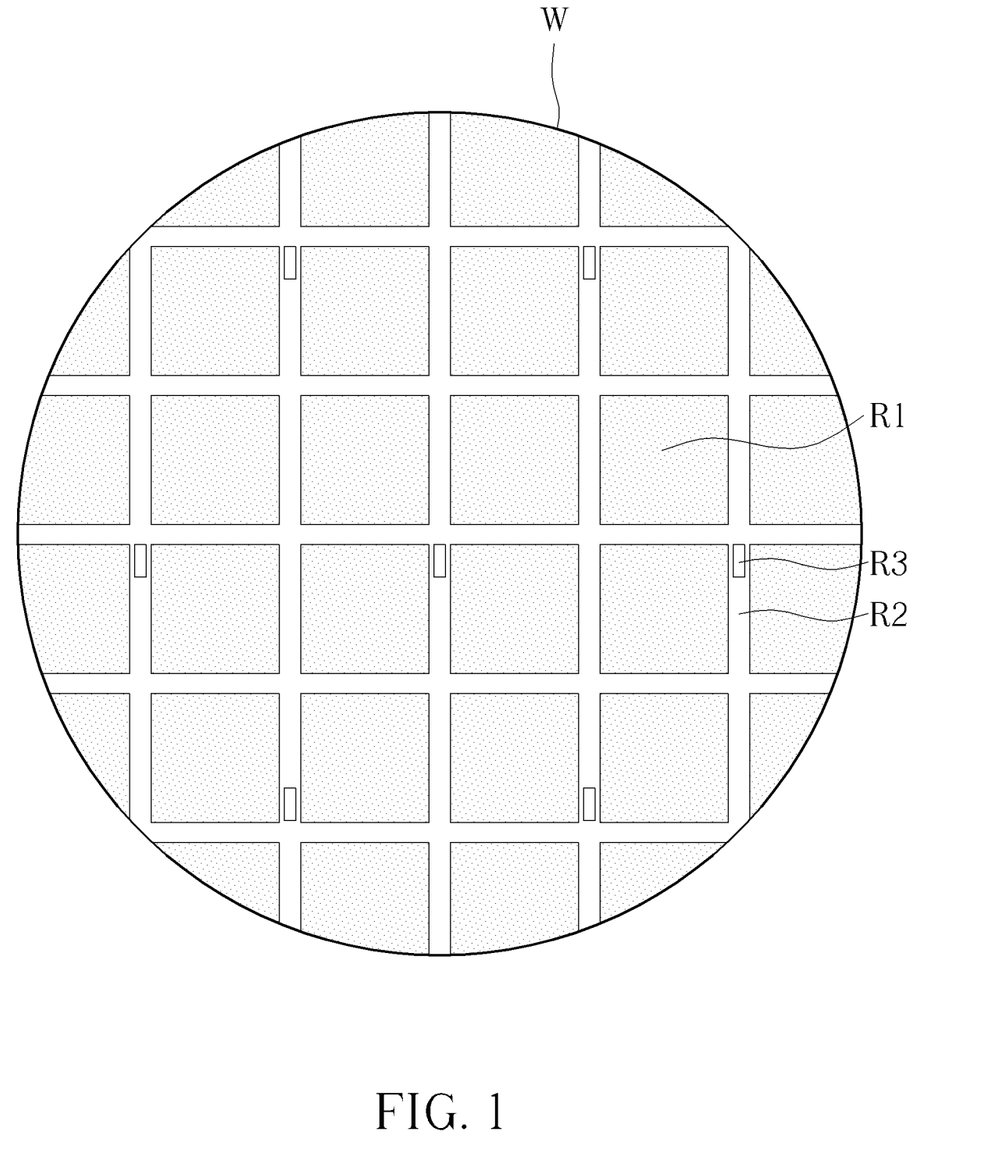
FIG. 1 is a schematic plan view of a semiconductor device according to an embodiment of the present invention.

Please refer to FIG. 1, which is a schematic plan view of a semiconductor device according to an embodiment of the present invention. The semiconductor device shown in FIG. 1 may be a wafer W that includes a plurality of chip regions R1 and a scribe line region R2 located between the chip regions R1. The chip regions R1 are where integrated circuit chips are fabricated. The scribe line region R2 is used for dicing the wafer W to separate the chip regions R1 after the fabrication process of the wafer W is completely. Various alignment mark patterns, monitoring patterns and testkey structures used during wafer fabrication may be arranged in the scribe line region R2. For example, as shown in FIG. 1, a plurality of testkey regions R3 may be arranged in different areas of the scribe line region R2 near the central and edge portions of the wafers W. A testkey structure may be formed in each of the testkey regions R3. During fabricating the wafer W, inspection steps may be performed to test the testkey structure to collect physical or electrical data of the wafer W for monitoring the process condition and an early alarm for process variation to ensure that the integrated circuit structures of the wafer W may meet the required specifications.

Figure 2:
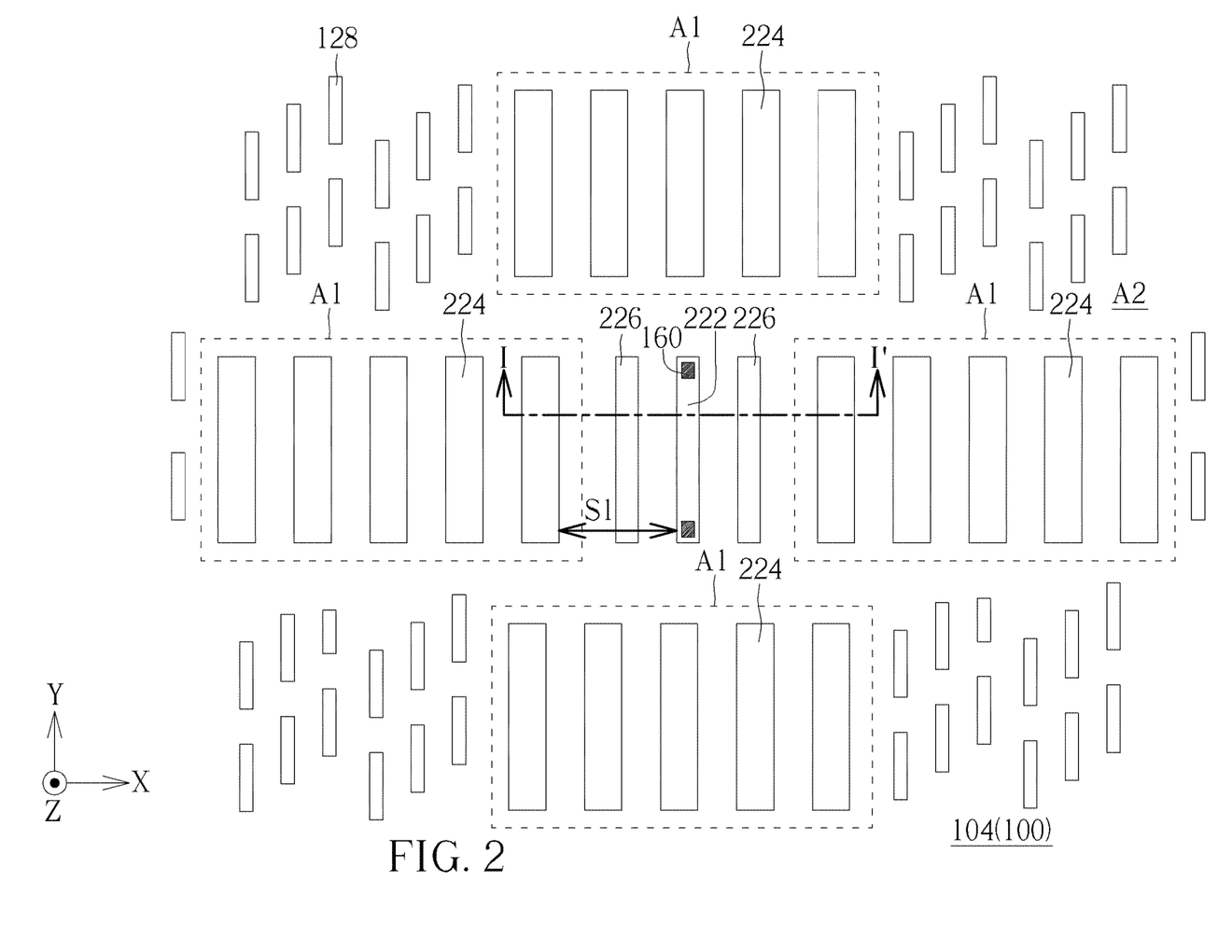
FIG. 2 is a schematic plan view of a testkey structure for a semiconductor device according to a first embodiment of the present invention.

Please refer to FIG. 2, which is a schematic plan view of a testkey structure for a semiconductor device according to a first embodiment of the present invention. The semiconductor device including the testkey structure may be, for example, the wafer W as shown in FIG. 1, and the testkey structure shown in FIG. 2 may be disposed in at least one of the testkey regions R3 of the scribe line region R2. For the sake of simplicity, some detailed structures such as spacers, etching stop layers and interlayer dielectric layers are not shown in FIG. 2.

As shown in FIG. 2, the testkey structure includes a substrate 100. The a plurality of first regions A1 and a second region A2 are defined in the substrate 100, wherein the first regions A1 are arranged around a portion of the second region A2. An isolation structure 104 is formed in the substrate 100 and extends through the first regions A1 and second region A2. A gate structure 222 extending along the first direction Y is disposed on the isolation structure 104 on the second region A2. A plurality of first dummy gate structures 224 extending along the first direction Y are disposed on the first regions A1 of the substrate 100 and arranged around the gate structure 222. Contact plugs 160 may be disposed on the two terminals of the gate structure 222 to electrically connect the gate structure 222 to other parts (not shown) of the semiconductor device or other circuits for measuring the resistance of the gate structure 222. The first dummy gate structures 224 are not electrically connected to any other part of the semiconductor device and are electrically isolated.

In order to obtain a more reliable resistance data, the gate structure 222 preferably has a sufficient length along the first direction Y. According to an embodiment of the present invention, the length of the gate structure 222 along the first direction Y is preferably not less than 15 um.

In order to effectively monitor the process condition of the replacement metal gate process for forming the gate structure 222, the width of the gate structure 222 along the second direction X is preferably designed according to a minimum gate line width provided by a design rule for the semiconductor device. For example, when the minimum gate line width of the design rule is about 0.03 um, the width of the gate structure 222 may be about 0.03 um, 0.035 um, 0.04 um, 0.045 um, 0.05 um, or within a range defined by any two of these values. According to an embodiment of the present invention, the first dummy gate structures 224 may have a same length along the first direction Y, and the length of the first dummy gate structures 224 is preferably larger than or equal to the length of the gate structure 222. For example, when the length of the gate structure 222 is about 15 um, the length of the first dummy gate structures may be larger than or equal to 15 um. According to an embodiment of the present invention, the first dummy gate structures 224 may have a same width along the second direction X, and the width of the first dummy gate structure 224 is preferably larger than the width of the gate structure 222. For example, the width of the first dummy gate structure 224 may be between 2 and 5 times of the width of the gate structure 222. According to an embodiment of the present invention, the width of the gate structure 222 is about 0.03 um, the first dummy gate structure 224 may be about 0.135 um. The gate structure 222 may be distanced from the first dummy gate structures 224 at two sides of the gate structure 222 by a space S1. According to an embodiment of the present invention, the space S1 may be about 0.2 um, 0.5 um, 1 um, 1.5 um, 2 um, 2.5 um, 3 um, or within a range defined by any two of these values.

The testkey structure may include more dummy structures other than the first dummy gate structures 224. For example, as shown in FIG. 2, the testkey structure may further include a pair of second dummy gate structures 226 disposed on the isolation structure 104 on the second region A2 and at two sides of the gate structure 222, and a plurality of third dummy gate structures 128 disposed on the isolation structure 104 on the second region A2 and arranged around the first regions A1. The second dummy gate structures 226 may have a same length and a same width that are the same as the length and the width of the gate structure 222. The third dummy gate structures 128 may have a same length and a same width that are smaller than the lengths and the widths of the first dummy gate structures 224 and the second dummy gate structures 226. In some embodiments, the gate structure 222, the first dummy gate structure 224, and the second dummy gate structures 226 are formed on the substrate 100 through a same replacement metal gate (RMG) process and include the same metal gate material. In some embodiments, the third dummy gate structures 128 may include a material different from the material of the gate structure 222 and the first dummy gate structures 224. According to an embodiment of the present invention, the third dummy gate structures 128 may include polysilicon.

Figure 3:
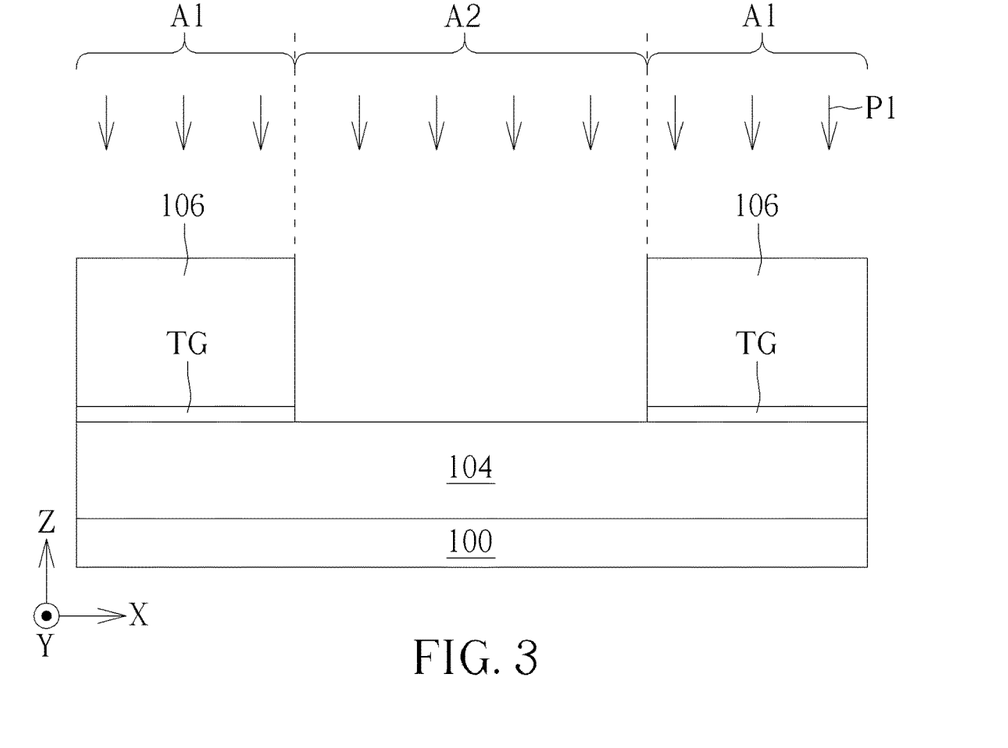
FIG. 3 to FIG. 8 are schematic cross-sectional views taken along line I-I' of the testkey structure shown in FIG. 2 at different stages of a manufacturing process.

Please refer to FIG. 3 to FIG. 8, which are schematic cross-sectional views taken along line I-I' of the testkey structure shown in FIG. 2 at different stages of a manufacturing process. The manufacturing process for forming the testkey structure shown in FIG. 2 may include the following steps. First, as shown in FIG. 3, a substrate 100 is provided. The substrate 100 may include a silicon substrate, a silicon-on-insulator (SOI) substrate, a silicon germanium substrate, a Group III-V semiconductor substrate, or a substrate made of any suitable materials. Following, an isolation structure 104 is formed in the substrate 100 to define a plurality of active regions (not shown) in the substrate 100. The isolation structure 104 may be shallow trench isolation (STI) structure or local oxidation of silicon. The isolation structure 104 is made of a dielectric material, such as silicon oxide ($SiO_2$), silicon nitride (SiN), silicon oxynitride (SiON), silicon nitride carbide (SiCN), nitrogen doped silicon carbide (NDC), low-k dielectric materials such as fluorosilicate glass (FSG), silicon carbon oxide (SiCOH), spin-on glass, porous low-k dielectric materials, organic polymer dielectric materials, or a combination of the above materials, but is not limited thereto. Subsequently, a deposition process such as a chemical vapor deposition (CVD) process, a physical vapor deposition (PVD) process, or an atomic layer deposition (ALD) process may be performed to form a gate dielectric layer TG on all of the substrate 100. The material of the gate dielectric layer TG may include silicon oxide or high-k dielectric material. Subsequently, a mask layer 106 (such as a patterned photoresist layer) may be formed on the substrate 100 to cover the first regions A1 and expose the second region A2 of the substrate 100. After that, an etching process P1 is performed, using the mask layer 106 as an etching mask to etch the exposed portion of the gate dielectric layer TG until the portion of the gate dielectric layer TG on the second region A2 of the substrate 100 is completely removed and the isolation structure 104 on the second region A2 is exposed.

Figure 4:
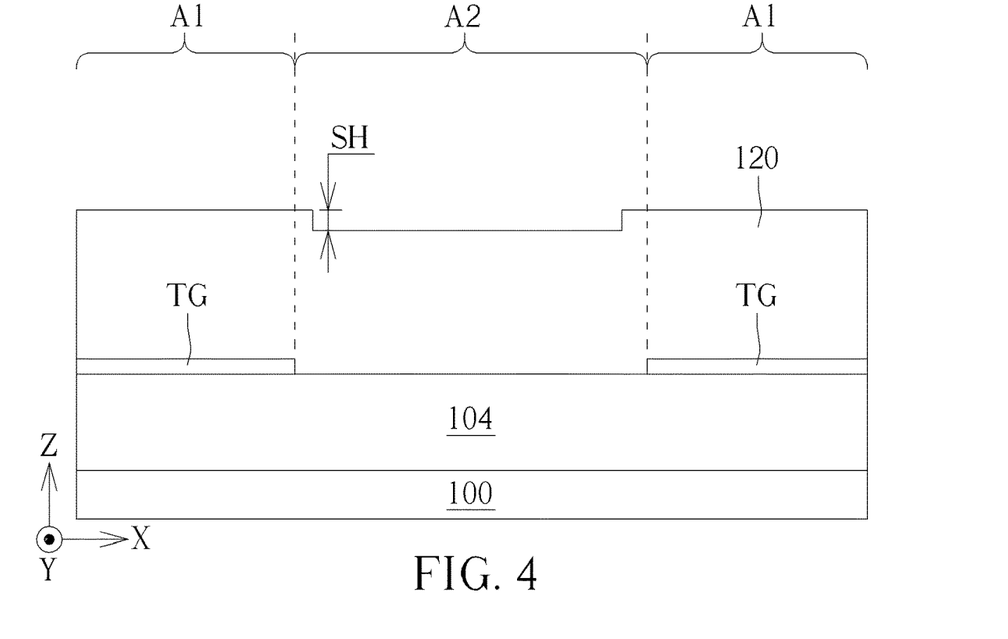

Subsequently, as shown in FIG. 4, the mask layer 106 is removed and a chemical vapor deposition (CVD) process may be performed to form a sacrificial material layer 120 on the substrate 100 in a blanket manner. The material of the sacrificial material layer 120 may include polysilicon, but is not limited thereto. Since the gate dielectric layer TG on the second region A2 of the substrate 100 has been selectively removed, the top surface of the sacrificial material layer 120 on the second region A2 may be lower than the top surface of the sacrificial material layer 120 on the first regions A1 by a step height SH. The height of the step height SH is determined by the thickness of the gate dielectric layer TG.

Figure 5:
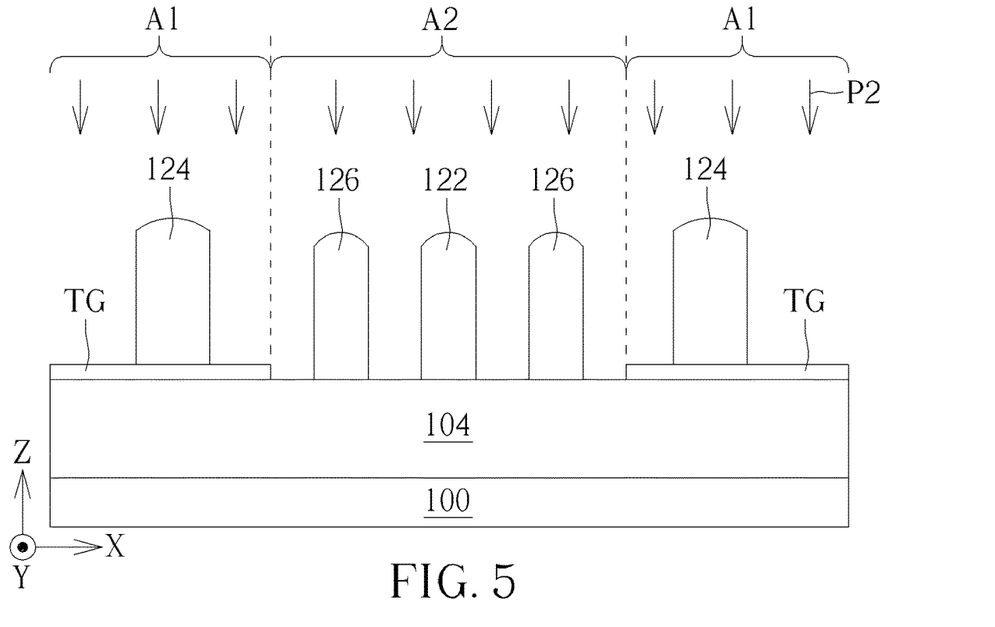

Subsequently, as shown in FIG. 5, a patterning process P2 (such as a photolithography-etching process) may be performed to pattern the sacrificial material layer 120, thereby forming the sacrificial gate structures 122 and 126 on the second region A2 of the substrate 100 and the sacrificial gate structures 124 on the first regions A1 of the substrate 100. Because of the non-flat top surface of the sacrificial material layer 120, the top surfaces of the sacrificial gate structures 122 and 126 would appear to be lower than the top surfaces of the sacrificial gate structures 124. According to an embodiment of the present invention, the top surfaces of the sacrificial gate structures 122 and 126 may be lower than the top surfaces of the sacrificial gate structures 124 by the step height SH. According to an embodiment of the present invention, the top portions of the sacrificial gate structures 122, 126 and 124 may respectively have a bowing profile. According to an embodiment of the present invention, a portion of the sacrificial material layer 120 on the second region A2 may be patterned to form the third dummy gate structures 128 (shown in FIG. 2).

Figure 6:
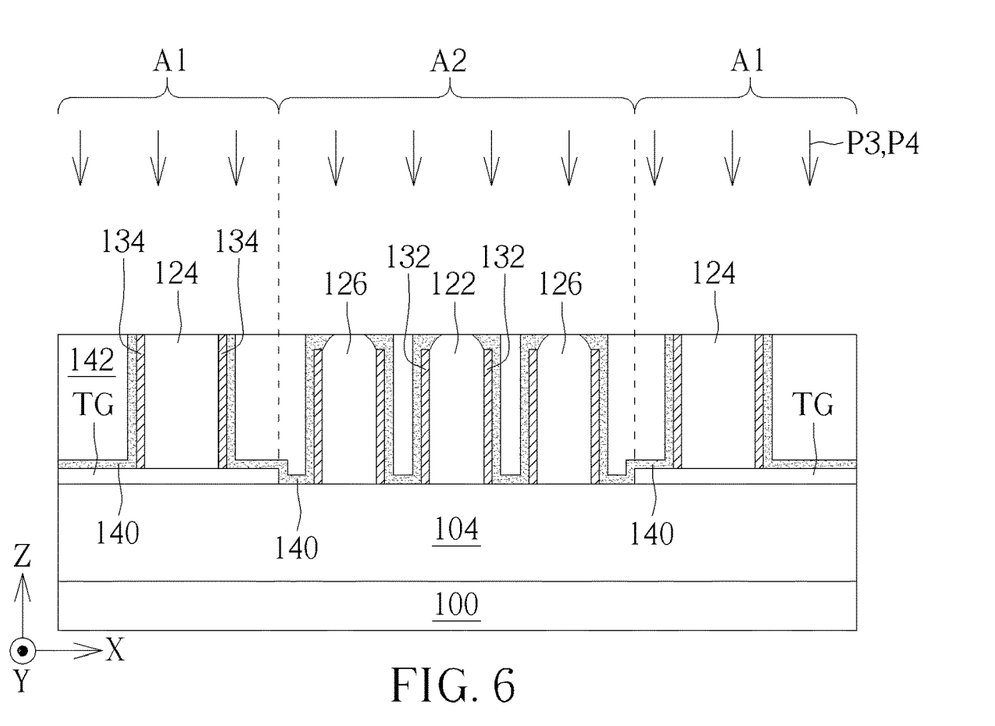

Subsequently, as shown in FIG. 6, one or more deposition/etch processes may be performed to form spacers 132 (first spacers) on the sidewalls of the sacrificial gate structures 122 and 126 and form spacers 134 (second spacers) on the sidewalls of the sacrificial gate structures 124. After that, deposition processes may be performed to form an etching stop layer 140 and an interlayer dielectric layer 142 on the substrate 100 to completely cover the sacrificial gate structures 122, 126 and 124 and fill the spaces between the sacrificial gate structures 122, 126 and 124. Following, a removal process P3 (such as a CMP process) may be performed to partially remove the interlayer dielectric layer 142 until portions of the etching stop layer 140 directly on the top surfaces of the sacrificial gate structures 122, 124 and 126 are exposed. After that, another removal process P4 (such as a CMP process or an etching process) may be performed to remove a portion of the etching stop layer 140 (the interlayer dielectric layer 142 may be further removed) until the top portions of the sacrificial gate structures 122, 124 and 126 are exposed. The spacers 132, 134 and the etching stop layer 140 may respectively include a single layer or a multilayer structure. The materials used to form the spacers 132, 134 and the etching stop layer 140 may include dielectric materials such as silicon oxide ($SiO_2$), silicon nitride (SiN), silicon oxynitride (SiON), silicon nitride carbide (SiCN), nitrogen doped silicon carbide (NDC), low-k dielectric materials such as fluorosilicate glass (FSG), silicon carbon oxide (SiCOH), spin-on glass, porous low-k dielectric materials, organic polymer dielectric materials, or a combination of the above materials, but is not limited thereto. According to an embodiment of the present invention, the bowing top portions of the sacrificial gate structures 124 (or the portions of the sacrificial gate structures 124 protruding from the spacers 134) may be completely removed during the removal process P4. Accordingly, the top portions of the sacrificial gate structures 124 may have a flat profile after the removal process P4. As shown in FIG. 6, the top surfaces of the spacers 134 may be exposed from the surface of the interlayer dielectric layer 142 and approximately flush with the surface 142 of the interlayer dielectric layer 142. In some embodiments, most of the bowing top portions of the sacrificial gate structures 122, 126 are kept after the removal process P4. Only the topmost portions of the bowing portions are flattened after the removal process P4. The top surfaces of the spacers 132 are lower than the top surfaces of the sacrificial gate structures 122, 126 and are covered by the etching stop layer 140 without being exposed.

Figure 7:
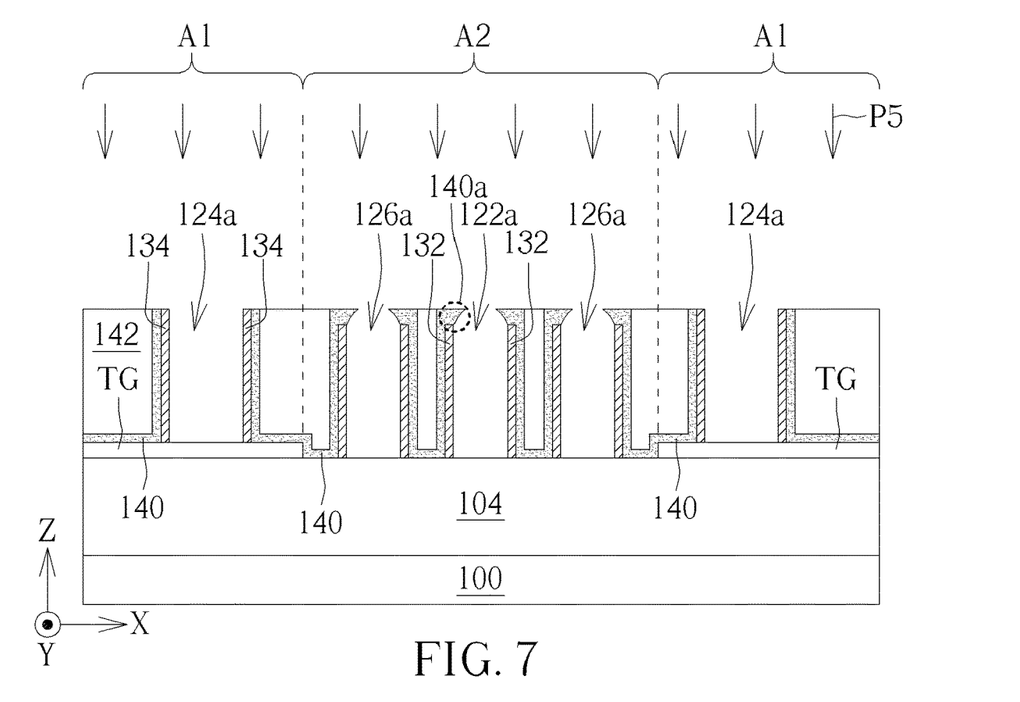
Figure 8:
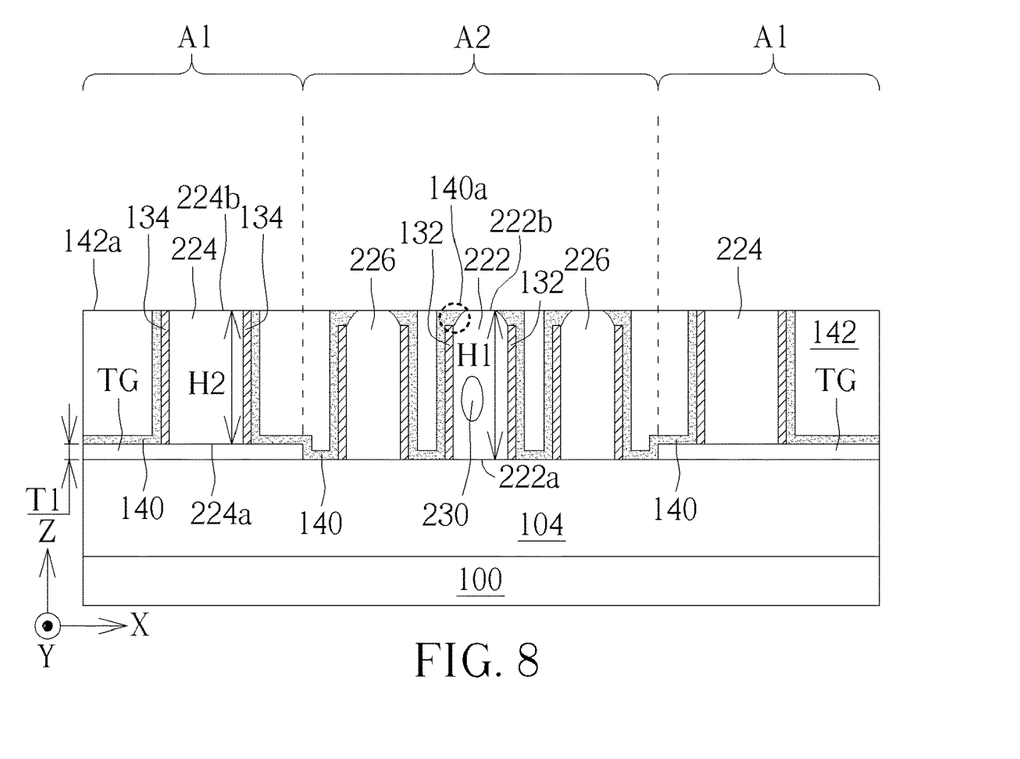

Subsequently, as shown in FIG. 7 and FIG. 8, a replacement metal gate (RMG) process is performed to replace the sacrificial gate structures 122, 124 and 126 with the gate structure 222, the first dummy gate structures 224 and the second dummy gate structures 226. The RMG process may include the successive steps of performing an etching process P5 (such as wet etching) to remove the sacrificial gate structures 122, 124 and 126 to form corresponding gate trenches 122a, 124a and 126a, forming a high-k dielectric layer and a metal gate material on the interlayer dielectric layer 142 and completely filling the gate trenches 122a, 124a and 126a, and then performing a CMP process or an etching process to remove the high-k dielectric layer and the metal gate material outside the gate trenches 122a, 124a and 126a, thereby obtaining the gate structure 222, the first dummy gate structures 224, and the second dummy gate structures 226 in the gate trenches 122a, 124a and 126a. According to an embodiment of the present invention, the high-k dielectric layer may include silicon nitride (SiN), silicon oxynitride (SiON), or a metal oxide. The metal gate material may include a multilayer structure. For example, the metal gate material may include at least a work-function metal layer and a low resistance metal layer, wherein the work-function metal layer may include titanium nitride (TiN), tantalum nitride (TaN), titanium carbide (TiC), tantalum carbide (TaC), tungsten carbide (WC), titanium aluminum nitride (TiAlN), titanium aluminide (TiAl), zirconium aluminide (ZrAl), tungsten aluminide (WAl), tantalum aluminide (TaAl), hafnium aluminide (HfAl), or a combination of the above materials, but is not limited thereto. The low resistance metal layer may include aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium tungsten (Ti/W), titanium and titanium nitride (Ti/TiN), or a combination of the above materials, but is not limited thereto. In some embodiments of the present invention, the gate structure 222, the first dummy gate structures 224, and the second dummy gate structures 226 may use a same material for forming their respective low resistance metal layers, such as aluminum (Al). After the RMG process, another dielectric layer (not shown) may be formed on the interlayer dielectric layer 142 and the gate structure 222, the first dummy gate structures 224, and the second dummy gate structures 226, and the contact plugs 160 (referring to FIG. 2) through the said another dielectric layer may be formed on the gate structure 222 and electrically connect to the gate structure 222. The contact plugs 160 may include a conductive material such as tungsten (W), copper (Cu), aluminum (Al), titanium (Ti), titanium nitride (TiN), tantalum (Ta), tantalum nitride (TaN), or a combination thereof, but is not limited thereto. No contact plugs or any other interconnect structures are formed on the first dummy gate structure 224 and the second dummy gate structure 226.

It should be noted that, as shown in FIG. 7, the a portion of the etching stop layer 140 covering the bowing top sidewall of the gate structure 122 may form a bird's peak portion 140a that extends horizontally toward the opening of the gate trench 122a after the etching process P5. The bird's peak portion 140a may reduce the width of the opening of the gate trench 122a and cause difficulty to fill the gate trench 122a by the metal gate material. Experiments have been carried out and it has been verified that the formation and dimension of the bird's peak portion 140a are significantly affected by the height of the step height SH. When the height of the step height SH is larger, it would be more likely to form an obvious bird's peak portion 140a of the etching stop layer 140 on the top of the gate structure 122 and increase the difficulty to fill the gate trench 122a by the metal gate material. As a result, a void defect 230 may be formed in the gate structure 222 and cause abnormal resistance of the gate structure 222. In some cases, the void defect 230 may cause serious line broken of the gate structure 222. It is found that void defects arise in the gate structures in the chip regions R1 (referring to FIG. 1) are mainly caused by the same mechanism of the void defect 230 (that is, the step height SH causes the bird's peak portion 140a, and the bird's peak portion 140a causes difficulty to fill the gate trench 122a). In other words, if the process is not well controlled, the void defect 230 may occur in the gate structure 222 of the testkey structure provided by the present invention and the gate structures of the integrated circuits in the chip regions R1 of the semiconductor device at the same time. Therefore, the present invention may conveniently use the in-line wafer acceptance test (WAT) step to measure testkey structure of the present invention to obtain the resistance of the gate structure 222, and then analyzing the resistance data of the gate structure 222 to determine if void defects exist in the gate structure 222 and the gate structures in the chip regions R1. In comparison with the conventional method using optical defect inspection tools (such as bright field inspection) to inspect the void defects, the present invention may achieve a faster inspection speed and be suitable for comprehensively inspecting each mass production wafer.

Please continue to refer to FIG. 8. The testkey structure provided by the first embodiment includes a substrate 100. A plurality of first regions A1 and a second region A2 are defined in the substrate 100, wherein the first regions A1 are arranged around a portion of the second region A2. An isolation structure 104 is formed in the substrate 100 and extends through the first regions A1 and second region A2. A gate dielectric layer TG is disposed on the isolation structure 104 and covers the portions of the isolation structure 104 directly on the first regions A1. The portion of the isolation structure 104 directly on the second region A2 of the substrate 100 is exposed from the gate dielectric layer TG. The interlayer dielectric layer 142 is disposed on the isolation structure 104 and the gate dielectric layer TG. The first dummy gate structures 224 are embedded in the interlayer dielectric layer 142 directly above the first regions A1 of the substrate 100. The bottom surfaces 224a of the first dummy gate structures 224 are in direct contact with the surface of the gate dielectric layer TG. The top surfaces 224b of the first dummy gate structures 224 are flush with the surface 142a of the interlayer dielectric layer 142. The gate structure 222 is buried in the interlayer dielectric layer 142 directly above the second region A2 of the substrate 100. The bottom surface 222a of the gate structure 222 is in direct contact with the surface of the isolation structure 104 and is lower than the bottom surfaces 224a of the first dummy gate structures 224. The top surface 222b of the gate structure 222 is flush with the surface 142a of the interlayer dielectric layer 142 and the top surfaces 224b of the first dummy gate structures 224. The height H1 of the gate structure 222 is greater than the height H2 of the first dummy gate structures 224. The height H1 of the gate structure 222 may be approximately equal to a sum of the height H2 of the first dummy gate structures 224 and the thickness T1 of the gate dielectric layer TG (H1=H2+T1). The sidewall of the top portion of the gate structure 222 may have a bowing profile. A portion of the etching stop layer 140 on the sidewall of the top portion of the gate structure 222 includes a bird's peak portion 140a.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
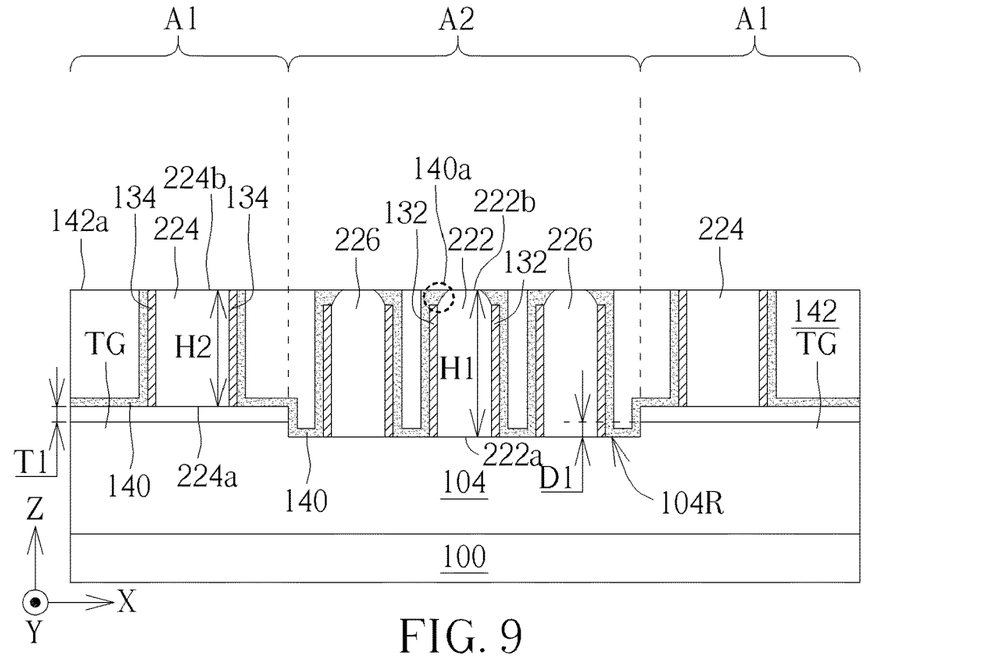
FIG. 9 is a schematic cross-sectional view of a testkey structure for a semiconductor device according to a second embodiment of the present invention.

FIG. 9 is a schematic cross-sectional view of a testkey structure for a semiconductor device according to a second embodiment of the present invention. The main difference between the testkey structure of FIG. 9 and the testkey structure of FIG. 8 is that, in FIG. 9 the isolation structure 104 on the second region A2 is partially removed during the etching process P1 (referring to FIG. 3) to form a recessed region 104R. Therefore, the height of the step height SH (referring to FIG. 4) is determined by the thickness T1 of the gate dielectric layer TG and the depth D1 of the recessed region 104R. As shown in FIG. 9, the edge of the recessed region 104R may be aligned with the edge of the gate dielectric layer TG along a vertical direction (such as the third direction Z). The gate structure 222 is disposed in the recessed region 104R, so that the bottom surface 222a of the gate structure 222 is much lower than the bottom surfaces 224a of the first dummy gate structures 224. The height H1 of the gate structure 222 may be approximately equal to a sum of the height H2 of the first dummy gate structures 224 and the thickness T1 of the gate dielectric layer TG and the depth D1 of the recess 140R (H1=H2+T1+D1).

Figure 10:
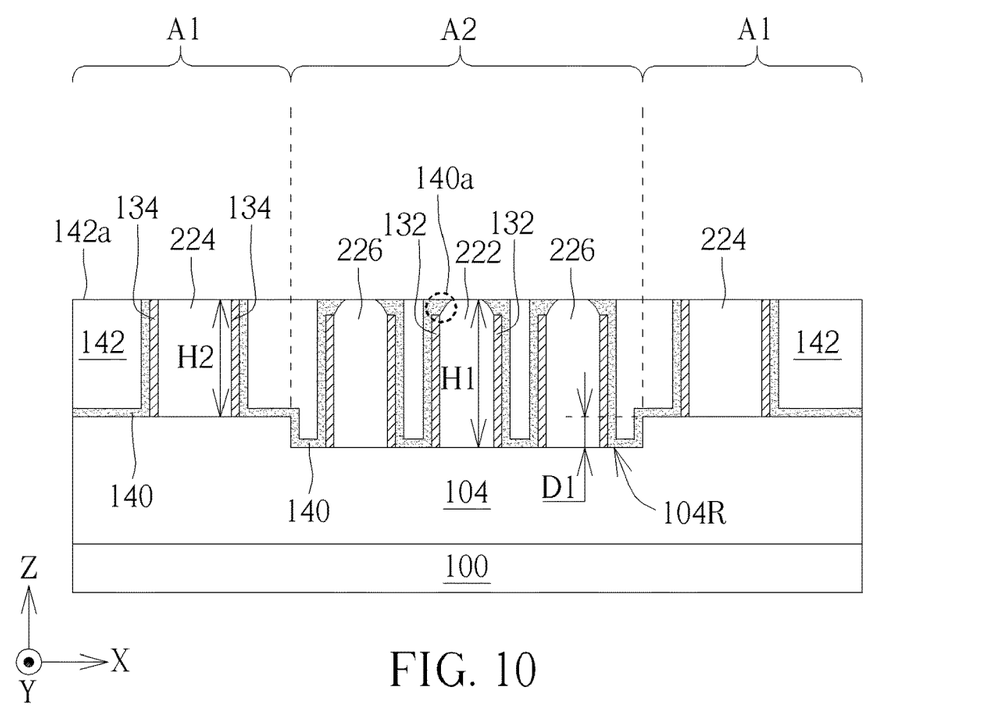
FIG. 10 is a schematic cross-sectional view of a testkey structure for a semiconductor device according to a third embodiment of the present invention.

FIG. 10 is a schematic cross-sectional view of a testkey structure for a semiconductor device according to a third embodiment of the present invention. The main difference between the testkey structure of FIG. 10 and the testkey structure of FIG. 8 is that, in FIG. 10 the testkey structure does not include the gate dielectric layer TG. The first dummy gate structures 224 are directly disposed on the isolation structure 104 on the first regions A1 of the substrate. The isolation structure 104 on the second region A2 of the substrate 100 is partially removed during the etching process P1 (referring to FIG. 3) to form a recessed region 104R, Therefore, the height of the step SH (referring to FIG. 4) is determined by the depth D1 of the recess 104R. The height H1 of the gate structure 222 may be approximately equal to a sum of the height H2 of the first dummy gate structures 224 and the depth D1 of the recess 140R (H1=H2+D1).

Figure 11:
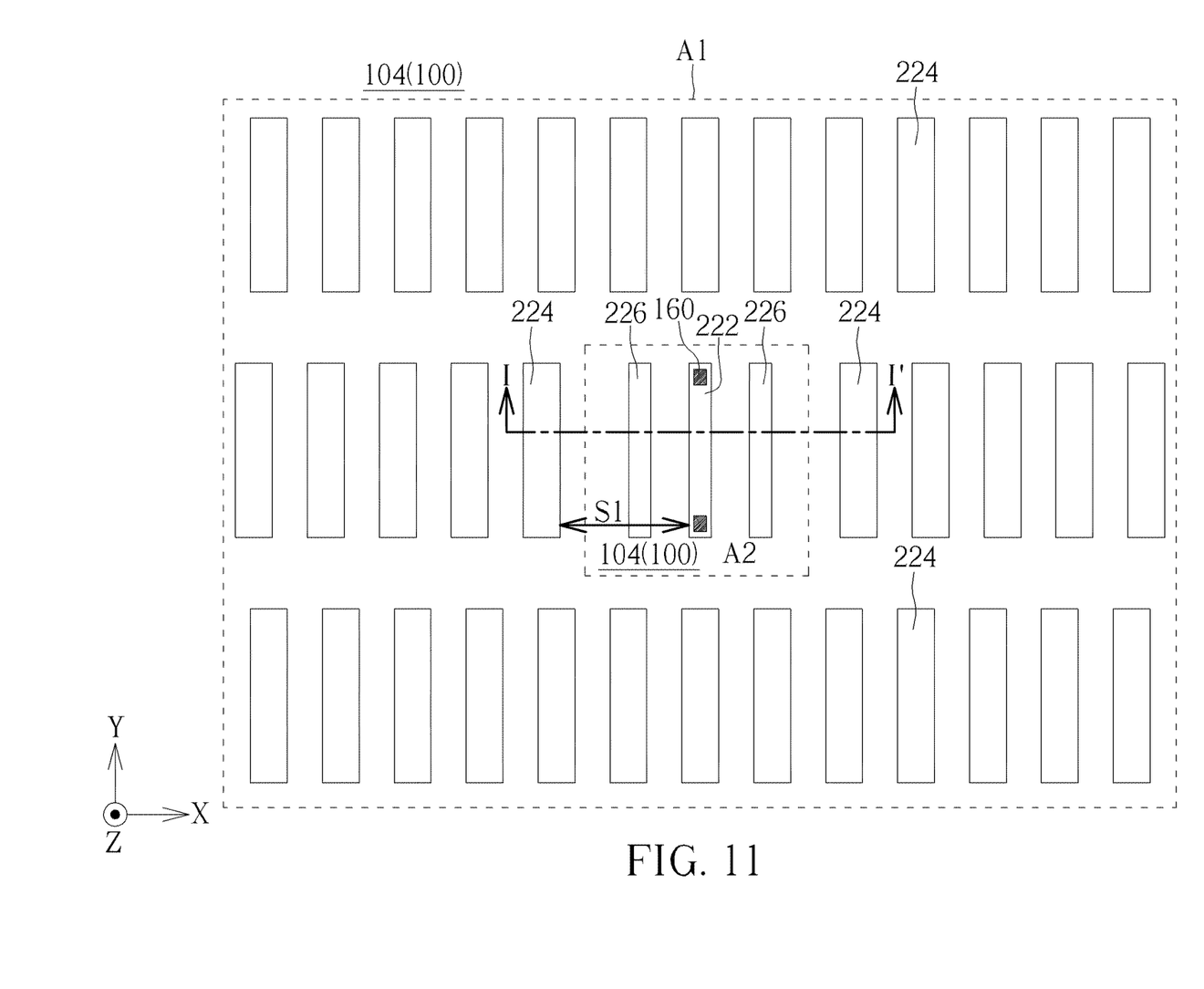
FIG. 11 is a schematic plan view of a testkey structure for a semiconductor device according to a fourth embodiment of the present invention.

FIG. 11 is a schematic plan view of a testkey structure for a semiconductor device according to a fourth embodiment of the present invention. The main difference between the testkey structure shown in FIG. 11 and the testkey structure shown in FIG. 2 is that in FIG. 11 the first region A1 of the substrate 100 has a closed-ring shape and completely surrounds the second region A2 where the gate structure 222 is disposed on. The testkey structure shown in FIG. 11 may have the same cross-sectional structure along the line I-I' as shown in FIG. 8, FIG. 9 or FIG. 10.

Figure 12:
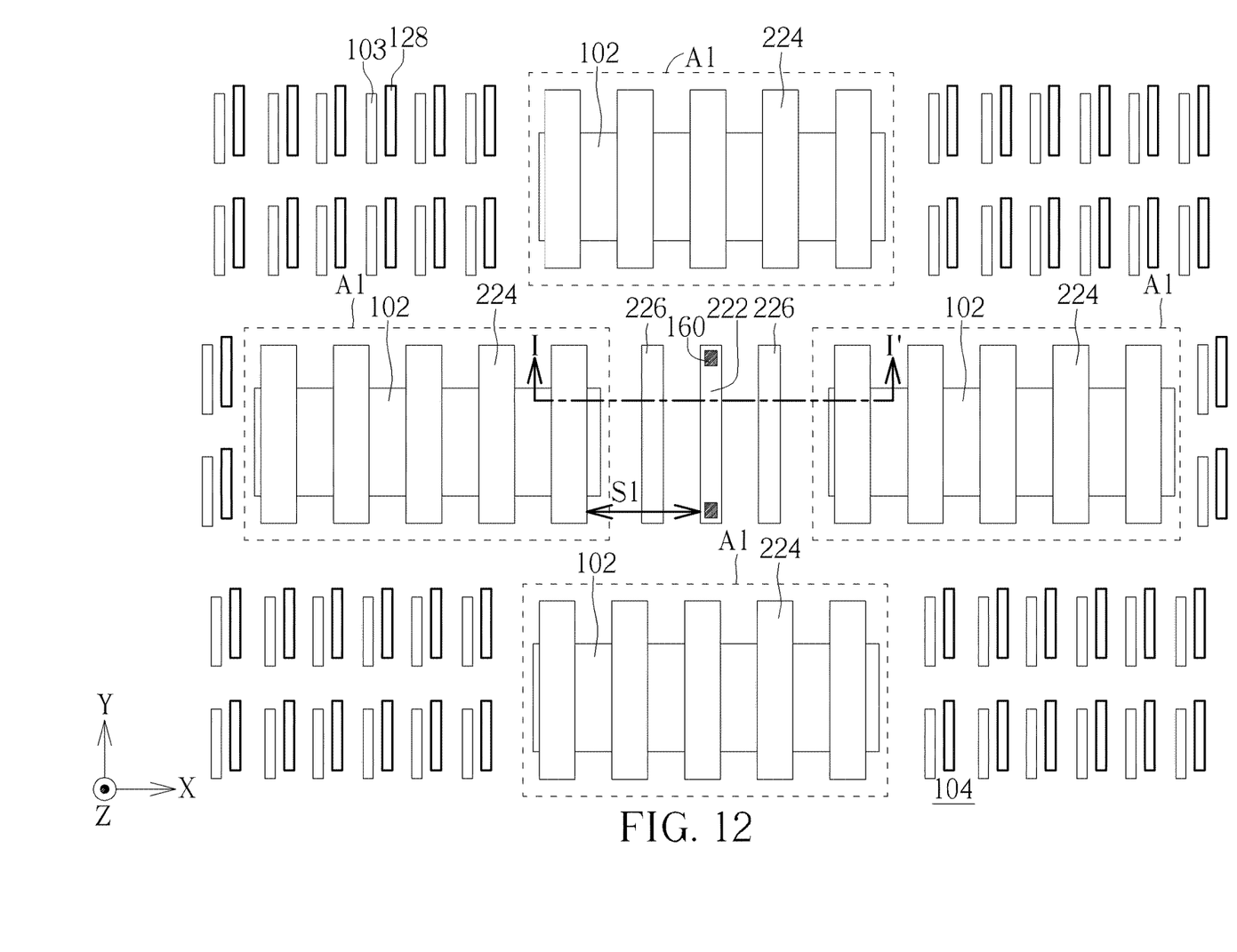
FIG. 12 is a schematic plan view of a testkey structure for a semiconductor device according to a fifth embodiment of the present invention.
Figure 13:
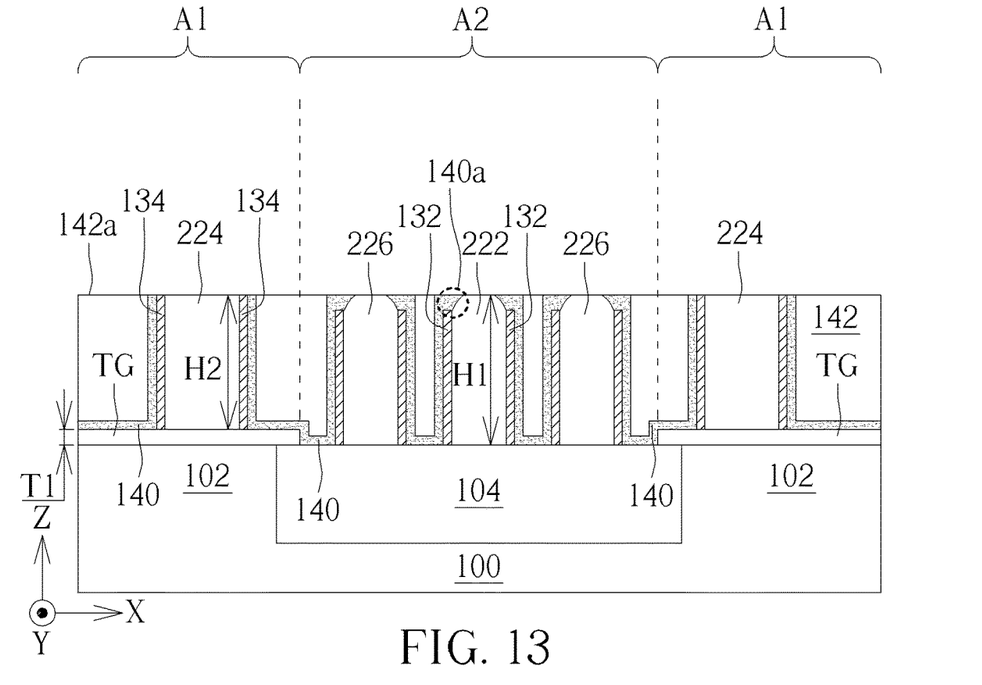
FIG. 13 is a schematic cross-sectional view taken along line I-I' of the testkey structure shown in FIG. 12.

FIG. 12 is a schematic plan view of a testkey structure for a semiconductor device according to a fifth embodiment of the present invention. FIG. 13 is a schematic cross-sectional view taken along line I-I' of the testkey structure shown in FIG. 12. The main difference between the testkey structure shown in FIG. 12 and FIG. 13 and the testkey structure shown in FIG. 2 and FIG. 8 is that the testkey structure shown in FIG. 12 and FIG. 13 further includes active regions 102 respectively disposed in the first regions A1 of the substrate 100 and surrounded by the isolation structure 104, and a plurality dummy active regions 103 disposed in the second region A2 of the substrate 100 and arranged around the first regions A1. The first dummy gate structures 224 are disposed on the active regions 102 and extend across the active region 102 along the first direction Y. As shown in FIG. 13, the gate dielectric layer TG covers the surface of the active regions 102 and extends toward the isolation structure 104 to cover the surface of the isolation structure 104 near the active regions 102. The height H1 of the gate structure 222 may be approximately equal to a sum of the height H2 of the first dummy gate structure 224 and the thickness T1 of the gate dielectric layer TG (H1=H2+T1).

Figure 14:
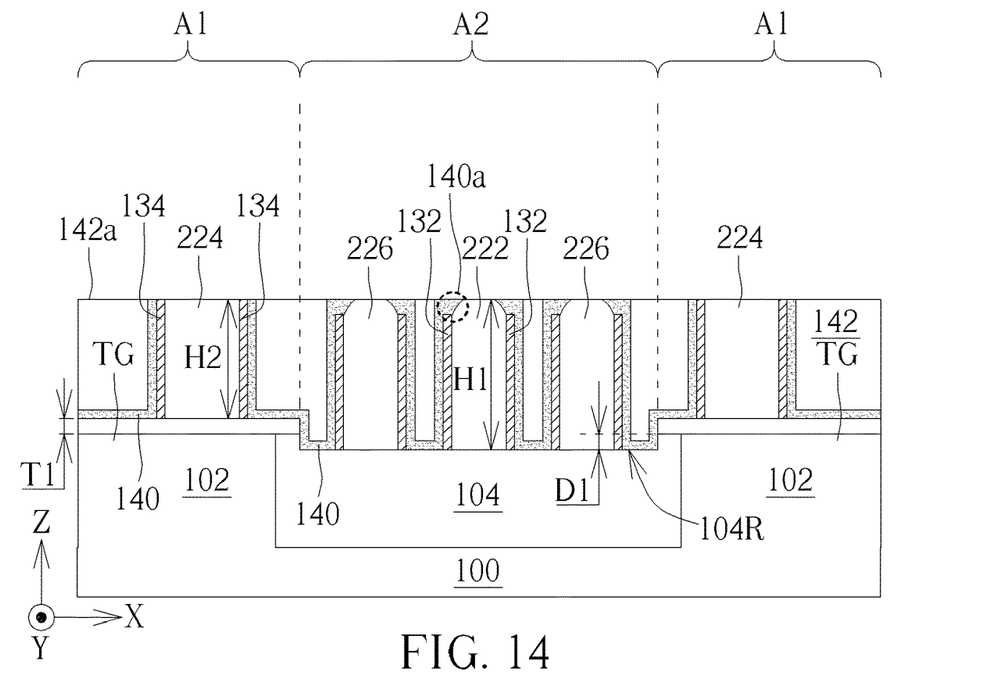
FIG. 14 is a schematic cross-sectional view of a testkey structure for a semiconductor device according to a sixth embodiment of the present invention.

FIG. 14 is a schematic cross-sectional view of a testkey structure for a semiconductor device according to a sixth embodiment of the present invention. The main difference between the testkey structure shown in FIG. 14 and the testkey structure shown in FIG. 13 is that in FIG. 14 the isolation structure 104 on the second region A2 of the substrate 100 is partially removed during the etching process P1 (referring to FIG. 3) to form a recessed region 104R. The edge of the recessed region 104R may be aligned with the edge of the gate dielectric layer TG on the isolation structure 104 along a vertical direction (such as the third direction Z). The height H1 of the gate structure 222 may be approximately equal to a sum of the height H2 of the first dummy gate structure 224 and the thickness T1 of the gate dielectric layer TG and the depth D1 of the recess 140R (H1=H2+T1+D1).

Figure 15:
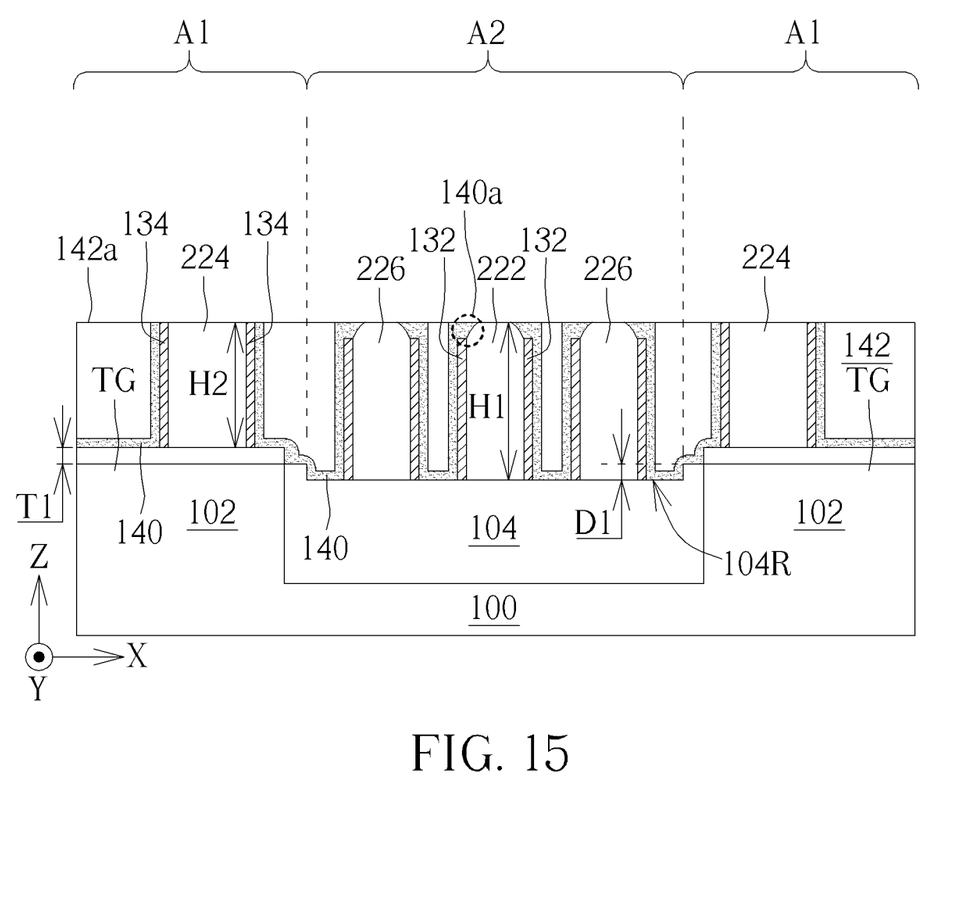
FIG. 15 is a schematic cross-sectional view of a testkey structure for a semiconductor device according to a seventh embodiment of the present invention.

FIG. 15 is a schematic cross-sectional view of a testkey structure for a semiconductor device according to a seventh embodiment of the present invention. The main difference between the testkey structure shown in FIG. 15 and the testkey structure shown in FIG. 13 is that the gate dielectric layer TG shown in FIG. 15 may be formed by oxidizing the material of the active regions 102. Therefore, the gate dielectric layer TG would only be formed on the active regions 102, without extending to cover any portion of the isolation structure 104. The edge of the gate dielectric layer TG and the edge of the active region 102 are aligned along a vertical direction (such as the third direction Z).

Figure 16:
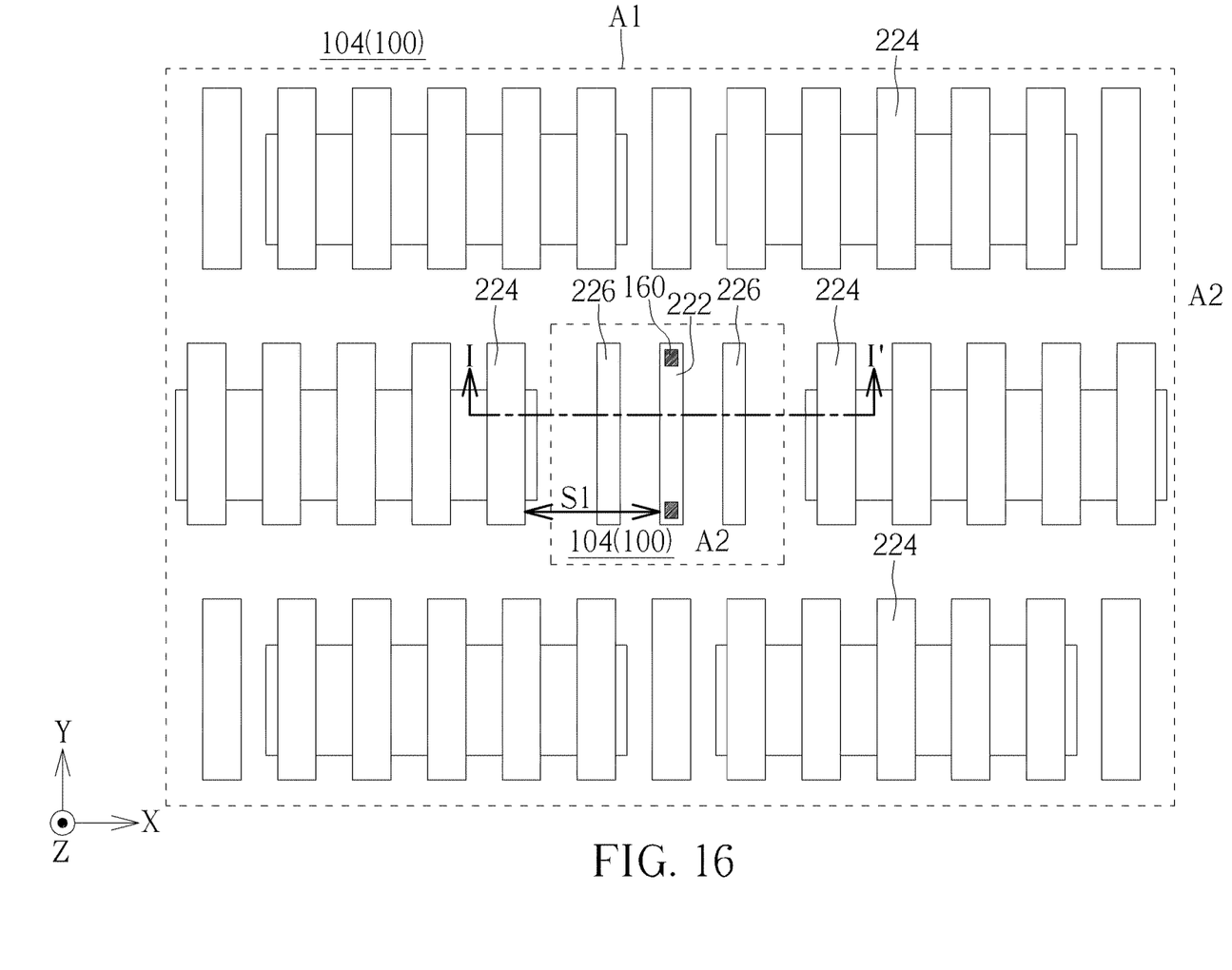
FIG. 16 is a schematic cross-sectional view of a testkey structure for a semiconductor device according to an eighth embodiment of the present invention.

FIG. 16 is a schematic cross-sectional view of a testkey structure for a semiconductor device according to an eighth embodiment of the present invention. The main difference between the testkey structure shown in FIG. 16 and the testkey structure shown in FIG. 12 is that in FIG. 16 the first region A1 of the substrate 100 has a closed-ring shape and completely surrounds the second region A2 where the gate structure 222 is disposed on. The testkey structure shown in FIG. 16 may have the same cross-sectional structure along the line I-I' as shown in FIG. 13, FIG. 14 or FIG. 15.

In conclusion, the testkey structure for a semiconductor device provided by the present invention may show the influence of the step height caused by the gate dielectric layer and/or the isolation structure on the replacement metal gate process. Furthermore, the resistance data of the testkey structure provided by the present invention may be conveniently tested by in line WAT step. The presence of the void defects and integrity of the gate structure may be judged by analyzing the WAT resistance data of the testkey structure. In comparison with the conventional method using optical defect inspection tools (such as bright field inspection) to inspect the void defects, the present invention may achieve a faster inspection speed and be suitable for comprehensively inspecting each mass production wafer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testkey structure for a semiconductor device, comprising:
   a substrate;
   a gate structure disposed on the substrate; and
   a plurality of first dummy gate structures disposed on the substrate and arranged around the gate structure, wherein a bottom surface of the gate structure is lower than bottom surfaces of the first dummy gate structures, and a top surface of the gate structure is flush with top surfaces of the dummy gate structures.

2. The testkey structure for a semiconductor device according to claim 1, further comprising an etching stop layer on the substrate and covering a sidewall of the gate structure and sidewalls of the first dummy gate structures, wherein the etching stop layer comprises a bird's peak portion on a top portion of the sidewall of the gate structure.

3. The testkey structure for a semiconductor device according to claim 1, wherein a top portion of the gate structure comprises a bowing profile.

4. The testkey structure for a semiconductor device according to claim 1, further comprising:
   a first spacer on a sidewall of the gate structure and comprising a top surface lower than the top surface of the gate structure; and
   a plurality of second spacers respectively on sidewalls of the first dummy gate structures, wherein top surfaces of the second spacers are flush with the top surfaces of the first dummy gate structures.

5. The testkey structure for a semiconductor device according to claim 1, further comprising an isolation structure disposed on the substrate.

6. The testkey structure for a semiconductor device according to claim 5, wherein the gate structure is disposed on a recessed region of the isolation structure, the first dummy gate structures are disposed on the isolation structure and outside the recessed region, a height of the gate structure equals to a sum of a height of the first dummy gate structures and a depth of the recessed region.

7. The testkey structure for a semiconductor device according to claim 5, further comprising a gate dielectric layer disposed between the first dummy gate structures and the isolation structure, wherein a height of the gate structure equals to a sum of a thickness of the gate dielectric layer and a height of the first dummy gate structures.

8. The testkey structure for a semiconductor device according to claim 1, further comprising:
an isolation structure disposed on the substrate, the gate structure being directly on the isolation structure;
a plurality of active regions on the substrate and arranged around the gate structure, wherein the first dummy gate structures are on the active regions; and
a gate dielectric layer disposed between the active regions and the first dummy gate structures.

9. The testkey structure for a semiconductor device according to claim 8, wherein the gate structure is disposed on a recessed region of the isolation structure, a height of the gate structure equals to a sum of a height of the first dummy gate structures and a depth of the recessed region.

10. The testkey structure for a semiconductor device according to claim 9, wherein an edge of the gate dielectric layer and an edge of the recessed region are aligned.

11. The testkey structure for a semiconductor device according to claim 9, wherein an edge of the gate dielectric layer and an edge of the active regions are aligned.

12. The testkey structure for a semiconductor device according to claim 1, further comprising two second dummy gate structures disposed at two sides of the gate structure and respectively between the gate structure and the first dummy gate structures.

13. The testkey structure for a semiconductor device according to claim 1, wherein the gate structure and the first dummy gate structures comprise a metal gate material.

14. The testkey structure for a semiconductor device according to claim 1, further comprising at least a contact plug disposed on the gate structure and electrically connected to the gate structure.

15. The testkey structure for a semiconductor device according to claim 1, wherein the first dummy gate structures are electrically isolated from any other part of the semiconductor device.

* * * * *